United States Patent
Almazan et al.

(10) Patent No.: US 10,447,255 B2
(45) Date of Patent: Oct. 15, 2019

(54) RESISTOR CONTROLLED TIMER CIRCUIT WITH GAIN RANGING

(71) Applicant: Analog Devices Global, Hamilton (BM)

(72) Inventors: Sherwin Paul Roldan Almazan, San Mateo (PH); George Redfield Spalding, Jr., Edinburgh (GB)

(73) Assignee: Analog Devices Global, Hamilton (BM)

( * ) Notice: Subject to any disclaimer, the term of this patent is extended or adjusted under 35 U.S.C. 154(b) by 48 days.

(21) Appl. No.: 15/601,517

(22) Filed: May 22, 2017

(65) Prior Publication Data

US 2017/0257086 A1  Sep. 7, 2017

Related U.S. Application Data

(62) Division of application No. 14/563,559, filed on Dec. 8, 2014, now Pat. No. 9,660,628.

(51) Int. Cl.
*H03K 3/00* (2006.01)
*H03K 5/1534* (2006.01)
(Continued)

(52) U.S. Cl.
CPC ......... *H03K 5/1534* (2013.01); *H03K 3/0231* (2013.01); *H03K 17/6871* (2013.01); *H03K 5/153* (2013.01)

(58) Field of Classification Search
CPC ...... H03F 1/245; H03F 1/72; H03F 2200/336; H03F 2200/451; H03F 1/0227; H03F 1/0277; H03F 3/195; H03F 3/245
See application file for complete search history.

(56) References Cited

U.S. PATENT DOCUMENTS 6,984,966 B2 * 1/2006 Kubota ................. H02M 3/156
  323/282
9,660,628 B2 5/2017 Almazan et al.
(Continued)

OTHER PUBLICATIONS

"U.S. Appl. No. 14/563,559, Ex Parte Quayle Action dated Sep. 22, 2016", 4 pgs.

(Continued)

*Primary Examiner* — Sibin Chen
(74) *Attorney, Agent, or Firm* — Schwegman Lundberg & Woessner, P.A.

(57) ABSTRACT

A timer circuit is provided comprising: a resistor; a programmable gain circuit coupled to amplify the reference level based upon a resistor and a selected gain; a detection circuit coupled to identify the amplified reference level based upon a resistor; a selection circuit configured to select the gain based at least in part upon the identified amplified reference level based upon a resistor; a comparator circuit configured to transition between providing a signal having a first value and providing a signal having a second value based at least in part upon comparisons of a reactive circuit element excitation level with the amplified reference level based upon a resistor and with a second reference level; and reactive circuit element excitation circuit configured to reverse excitation of the reactive circuit element in response to the comparator circuit transitioning between providing the signal having the first value and providing the signal having the second value.

23 Claims, 10 Drawing Sheets

(51) Int. Cl.
*H03K 17/687* (2006.01)
*H03K 3/0231* (2006.01)
*H03K 5/153* (2006.01)

(56) References Cited

U.S. PATENT DOCUMENTS

| | | |
|---|---|---|
| 2005/0074076 A1 | 4/2005 | Chen et al. |
| 2009/0135531 A1 | 5/2009 | Hirata |
| 2011/0157142 A1 | 6/2011 | Chung |
| 2012/0133410 A1 | 5/2012 | Wu et al. |
| 2016/0164506 A1 | 6/2016 | Almazon et al. |

OTHER PUBLICATIONS

"U.S. Appl. No. 14/563,559, Examiner Interview Summary dated Jul. 25, 2016", 3 pgs.
"U.S. Appl. No. 14/563,559, Non Final Office Action dated Apr. 26, 2016", 13 pgs.
"U.S. Appl. No. 14/563,559, Notice of Allowance dated Jan. 17, 2017", 5 pgs.
"U.S. Appl. No. 14/563,559, PTO Response to Rule 312 Communication dated Apr. 26, 2017", 2 pgs.
"U.S. Appl. No. 14/563,559, Response filed Apr. 1, 2016 to Restriction Requirement dated Feb. 1, 2016", 15 pgs.
"U.S. Appl. No. 14/563,559, Response filed Jul. 25, 2016 to Non Final Office Action dated Apr. 26, 2016", 18 pgs.
"U.S. Appl. No. 14/563,559, Response filed Nov. 21, 2016 to Ex Parte Quayle Action dated Sep. 22, 2016", 6 pgs.
"U.S. Appl. No. 14/563,559, Restriction Requirement dated Feb. 1, 2016", 5 pgs.
Rice, Frank, "Experiment 4 Comparators, positive feedback, and relaxation oscillators", [online]. Retrieved from the Internet: <http://web.archive.org/web/20140327073738/http://www.sophphx.caltech.edu/Physics_5/Experiment_4.pdf>, (2013), 19 pgs.
U.S. Appl. No. 14/563,559, filed Dec. 8, 2014, Resistor Controlled Timer Circuit With Gain Ranging, now U.S. Pat. No. 9,660,628.

* cited by examiner

RESISTOR CONTROLLED TIMER CIRCUIT WITH GAIN RANGING

CLAIM OF PRIORITY

This application is a divisional of and claims priority to U.S. patent application Ser. No. 14/563,559, filed Dec. 8, 2014, which is incorporated herein by reference in its entirety

TECHNICAL FIELD

This document pertains generally, but not by way of limitation, to electronic timing circuits.

BACKGROUND

Oscillator circuits are used in determining timing of events in electronic circuits. Oscillator circuits have been used in determining timing in which to de-assert a reset signal, for example. Oscillator circuits also have been used in watchdog timeout circuits in determining timing in which to reset a counter on a device input, for example.

A supervisory circuit is commonly used to monitor one or more parameters of devices such as power supplies and microprocessors which must be maintained within certain limits, and to take appropriate action if a parameter goes out of bounds, creating an unacceptable or dangerous situation, for example. Supervisory circuits have been used during a power up sequence to delay active usage of a device until system power has come up to a correct level and stabilized. For example, when supply voltage of a device such as a microprocessor has just returned back to its normal operating voltage level after being in a low voltage supply state (i.e. brown-out state), or after emerging from a 'hung' state, a supervisory circuit may delay active usage of the microprocessor until after its supply voltage has been within a normal operating range for at least a predefined time out period.

In particular, for example, supervisory circuits have been used to de-assert one or more reset signals to place a device into an active usage state. In the past, some supervisory circuits have included timer circuitry to determine duration of a predefined reset time out interval that occurs prior to de-assertion of one or more reset signals used to place a device into the active usage state. Some prior supervisory circuits have provided variable reset timeout intervals. Some prior timers have provided reset timeout intervals that are externally-tunable via an off-chip component, rather than being already fixed and pre-defined on-chip. External tenability can provide the flexibility to use the same supervisor circuit and its component timer in different kinds of applications with varying reset timeout period requirements.

FIG. 1 is an illustrative schematic diagram showing a prior timer circuit 100 that includes a tunable capacitor ($C_{ext}$) 102 to provide a tunable reset timeout period. The tunable capacitor 102 ordinarily is provided as a programmable off-chip (external) capacitor. The timer works by charging and discharging the external capacitor 102 between two voltage levels $V_{ref1}$ and $V_{ref2}$.

The timer circuit 100 includes first and second comparator circuits 106, 108 coupled to compare a capacitor voltage VC of the tunable capacitor 102 with each of a first reference voltage $V_{ref1}$ and a second reference voltage $V_{ref2}$. The comparator circuits 106, 108 are further coupled to provide first and second comparison voltage signals V1, V2 that transition in state in response to charging and discharging, respectively, of the capacitor 102 voltage VC. In other words, a value of the first comparison signal V1 transitions in response to the capacitor 102 charging, and a value of the second comparison signal V2 transitions in response to the capacitor 102 discharging. A latch circuit 110 is coupled to produce an output voltage VL having a value indicative of the most recently transitioned comparison voltage signal V1 or V2. In other words, between occurrences of transitions of the first and second comparison signals, the latch circuit 110 stores a value that is indicative of the most recently provided one of the first and second comparison voltage signals. That is, the latch circuit 110 stores a value indicative of which switch state the switch 114 currently is in at times while the capacitor voltage is between the two reference levels, $V_{ref1}$ and $V_{ref2}$.

The timer circuit 100 includes logic circuitry 112 and a switch 114. The logic circuitry 112 is coupled to receive the VL signal, which is fed back from the latch 110, and to also receive an Enable signal. In response to the Enable signal enabling the logic circuitry 112, the logic circuitry provides as its output a VI signal that acts as an input to the switch 114.

The switch 114 includes a PMOS device 116 and an NMOS device 118 having their drains coupled together so that the PMOS device 116 acts as a voltage pull-up device and the NMOS device acts as a voltage pull-down device. A first current source 120 is coupled to provide current I to a source of the PMOS device 116. A second current sink 122 is coupled to sink a current I from a source of the NMOS device 118. The drains of the PMOS device 116 and the NMOS device 118 are coupled to a switch output terminal 124 that is coupled to a first terminal of the tunable capacitor 102. A second terminal of the tunable capacitor 102 is coupled to ground.

The timer circuit 100 includes a counter circuit 126 that is coupled to receive as input the VL signal produced by the latch. The counter circuit 126 operates to count occurrences of rising (or falling) edges of the VL signal. The counter circuit 126 provides a timeout signal (TO) in response occurrence of m VL rising edges. Thus, the timer circuit 100 delays provision of a timeout signal until a count of VL rising edges reaches m. The timeout signal can be used by a supervisor circuit to determine when to de-assert a reset signal, for example.

In operation, when the Enable signal is high (that is, when the timer 100 is enabled) the two comparators 106, 108 sense when VC has reached one of the voltage thresholds, $V_{ref1}$ or $V_{ref2}$, and in response to determining that a threshold has been reached, produce a signal V1 or V2 that transitions the latch 110 to a different state. The output VL of the latch 110 feeds back to the input logic circuit 112, which controls the switch 114 to alternately turn on the pull-up PMOS device 116 or to turn on the NMOS pull-down device 118, to alternately switch in and out the current sources 120, 122, to alternately charge and discharge the capacitor 102. Meanwhile, the output of latch 110 is digitally divided by the counter 126 by a certain divide ratio m to generate the timeout signal TO after the occurrences of m transitions of the VL signal. The occurrence of the TO signal indicates that the reset timeout interval has elapsed.

With the capacitor charging and discharging currents I, the comparator thresholds $V_{ref1}$ and $V_{ref2}$, and the counter divide ratio m all fixed on-chip, varying the external capacitance $C_{ext}$ effectively changes the charge and discharge rate of the capacitor, thus realizing a variable oscillator frequency and thus, a tunable timeout period.

Neglecting the comparator offset and propagation delay, it can be derived that the time-out period of for the prior timer circuit of FIG. 1 can be represented as, $$\text{Timeout} = \frac{2mC_{ext}}{I}(Vref1 - Vref2).$$

From this equation, it can be seen that the time-out period is directly proportional to $C_{ext}$. The time-out period is also a function of the current I, the divide ratio m, and the difference between the pre-defined comparator thresholds, A capacitor as the variable external device, as in the circuit in FIG. 1 can readily achieve a time-out period range of up to four orders of magnitude using a suitable range of commercially-available external capacitor values.

Using off-chip capacitors, however, can have some disadvantages. For example, some external capacitors have a poor absolute value, as well as both temperature and voltage coefficient, thereby degrading the time-out accuracy. Moreover, the time-out period is also heavily dependent on the accuracy of the on-chip bias currents I.

SUMMARY

In one aspect, a circuit includes a resistor coupled to a current source to provide a current to the resistor to produce a resistor voltage level. A programmable gain circuit is coupled to amplify the resistor voltage level based upon a selected gain. A voltage level detection circuit is coupled to identify a present amplified resistor voltage level. A selection circuit configured to select the gain based at least in part upon the identified present amplified resistor voltage level. A comparator circuit configured to transition between providing a signal having a first value and providing a signal having a second value based at least in part upon comparisons of a capacitor voltage level with the amplified resistor voltage level and with a second reference voltage. A reactive circuit element excitation circuit is configured to reverse excitation of the capacitor in response to the comparator circuit transitioning between providing the signal having the first value and providing the signal having the second value.

In another aspect, a circuit includes a resistor coupled to a voltage source to provide a voltage across the resistor to produce a resistor current level. A programmable gain circuit is coupled to amplify the resistor current level based upon a selected gain. A current level detection circuit coupled to identify the amplified resistor current level. A selection circuit is configured to select the gain based at least in part upon the identified amplified resistor current level. A comparator circuit is configured to transition between providing a signal having a first value and providing a signal having a second value based at least in part upon comparisons of a inductor current level with the amplified resistor current level and with a second reference current. A reactive circuit element excitation circuit configured to reverse excitation of the inductor in response to the comparator circuit transitioning between providing the signal having the first value and providing the signal having the second value.

DESCRIPTION OF EMBODIMENTS

Figure 1:
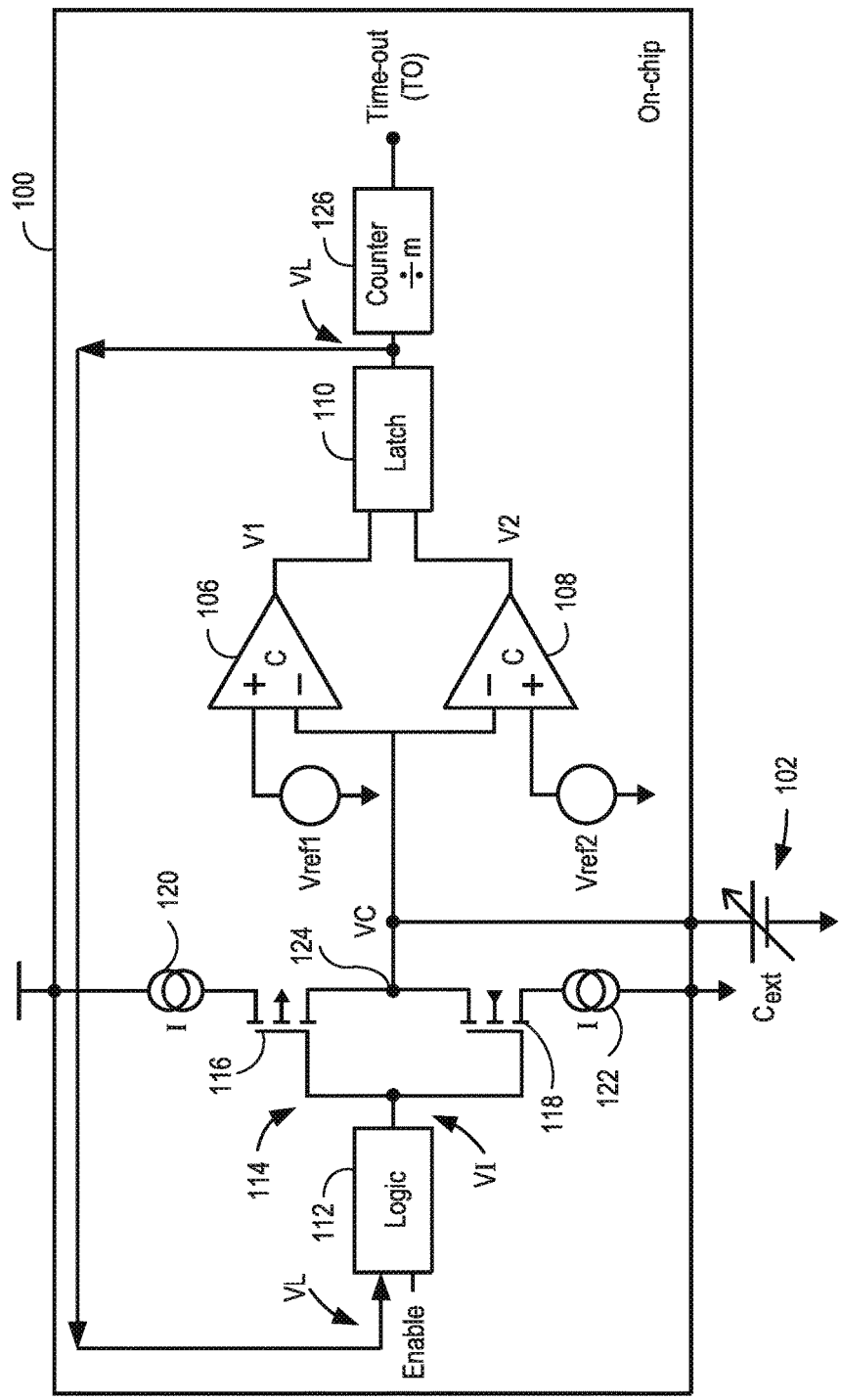
FIG. 1 is an illustrative schematic diagram showing a prior timer circuit that includes a tunable capacitor to provide a tunable reset timeout period.

The following description is presented to enable any person skilled in the art to create and use a resistor controlled timer circuit with gain ranging. Various modifications to the embodiments will be readily apparent to those skilled in the art, and the generic principles defined herein may be applied to other embodiments and applications without departing from the spirit and scope of the invention. Moreover, in the following description, numerous details are set forth for the purpose of explanation. However, one of ordinary skill in the art will realize that the invention might be practiced without the use of these specific details. In other instances, well-known data structures and processes are shown in block diagram form in order not to obscure the description of the invention with unnecessary detail. Identical reference numerals may be used to represent different views of the same item in different drawings. Flow diagrams in drawings referenced below are used to represent processes. A machine such as a controller is configured to perform these processes. The flow diagrams include modules that represent the configuration of a controller to perform the acts described with reference to these modules. Thus, the present invention is not intended to be limited to the embodiments shown, but is to be accorded the widest scope consistent with the principles and features disclosed herein.

Figure 2:
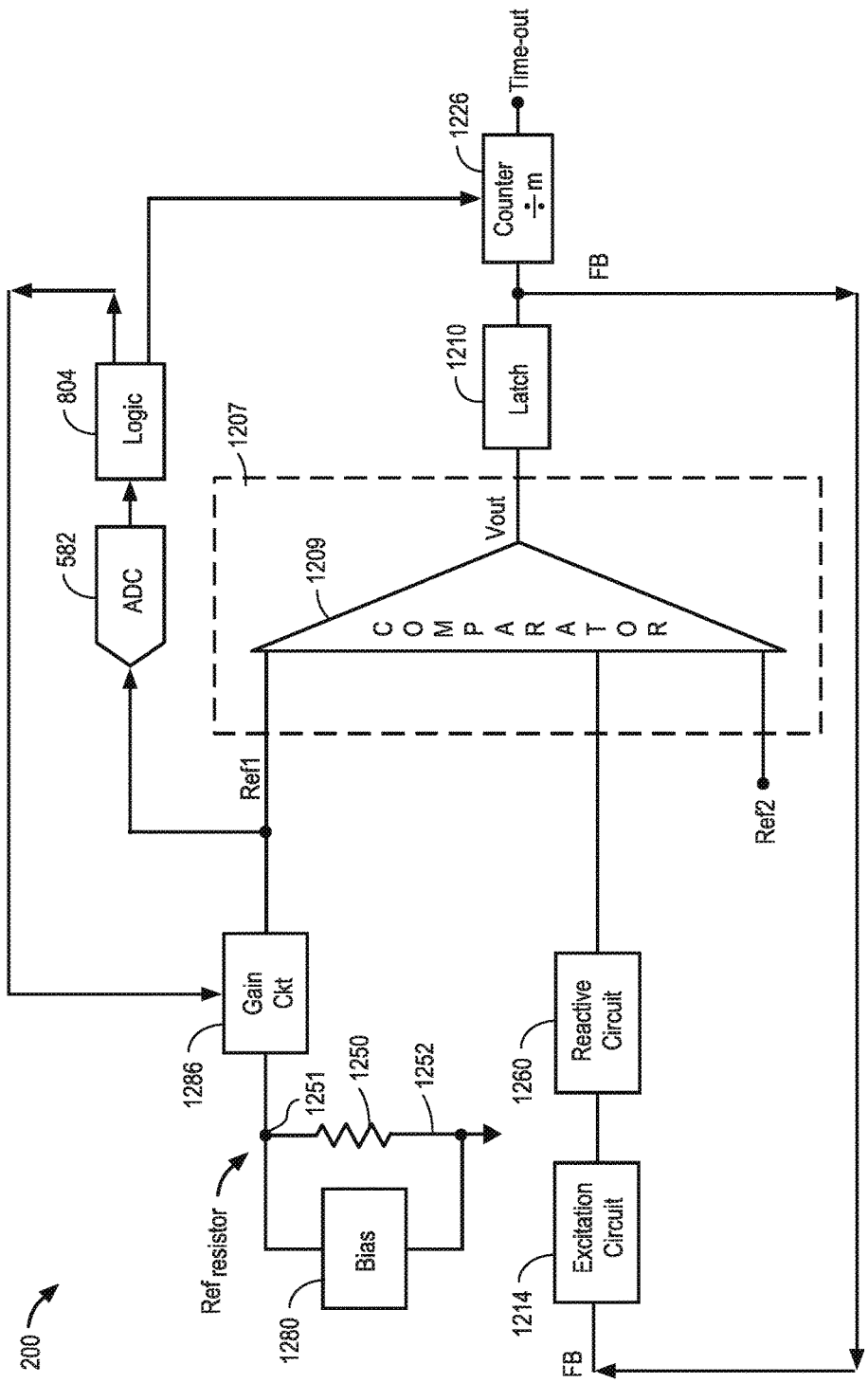
FIG. 2 is an illustrative schematic diagram showing a first embodiment of a timer circuit that includes a tunable resistor to provide a tunable reset timeout period in accordance with some embodiments.

FIG. 2 is an illustrative schematic diagram showing a first embodiment of a timer circuit 1200 that includes a tunable resistor ($R_{ext}$) 1250 to provide a tunable reset timeout period in accordance with some embodiments. The timer 1200 works through alternate excitation and reversal of a reactive element 1260, e.g., charging and discharging a voltage across a capacitor or increasing and decreasing current through an inductor. An excitation circuit 1214 is coupled to alternately excite and reverse excitation of the reactive element 1260. The timer circuit 1200 includes comparator circuitry 1207 shown within dashed lines that includes at least one comparator circuit 1209 coupled to compare a reactive element reference value $\text{Refr}_{eact}$ with each of a first reference $\text{Ref}_1$ and a second reference $\text{Ref}_2$. A first terminal of the comparator circuitry 1207 is coupled to receive a $\text{Ref}_1$ value, A second terminal of the comparator circuitry 1207 is coupled to receive a $\text{Ref}_2$ value.

The value $\text{Ref}_1$ is variable and is determined based at least in part upon the value of tunable resistor 1250. More particularly, a bias circuit 1280 is coupled to provide a reference bias across a first terminal 1251 of the resistor 1250 and a second terminal 1252 of the resistor 1250. The second terminal 1252 of the resistor 1250 also is coupled to a ground potential. The first terminal 1251 of the resistor 1250 also is coupled to provide an input signal to a programmable gain circuit 1286, which provides a value $\text{Ref}_1$ as its output. A gain circuit 1286 is coupled to provide a $\text{Ref}_1$ value as a function of a reference signal value $\text{Ref}_{resisitor}$ associated with the first terminal 1251 of the resistor 1250.

The reactive element 1260 is a capacitor in some embodiments and an inductor in other embodiments. For an embodiment in which the reactive element 1260 is a capacitor, the bias circuit 1280 produces a current through the resistor 1250 and the $\text{Ref}_{resistor}$ is a voltage value, and $\text{Ref}_1$ and $\text{Ref}_2$ also are voltage values. For an embodiment in which the reactive element 1260 is an inductor, the bias circuit 1280 produces a voltage source across the resistor 1250 and the $\text{Ref}_{resistor}$ is a current value, and $\text{Ref}_1$ and $\text{Ref}_2$ also are current values.

The comparator circuitry 1207 provides an output signal $V_{out}$ to an output signal state storage circuit 1210 that that stores an indication of the state of the most recently occurring value of output signal. In some embodiments, the state storage circuit 1210 includes a latch circuit. The state storage circuit is coupled to provide a feedback signal FB, which acts as a feedback signal that controls reactive element input $\text{Ref}_{react}$ to the comparator circuitry 1207. The comparator circuitry 1207 is coupled to provide the feedback signal FB signal having a first value in response to excitation of the reactive element 1260 and to provide the feedback signal FB having a second value in response to reversal of excitation of the reactive element 1260. The excitation circuit 1214 is coupled to reverse excitation of the reactive circuit element 1260 in response to the FB signal transitioning between the first and second values. More particularly, for a capacitor reactive element 1260, the excitation circuitry 1207 is configured to place a current source through the capacitor to ramp up or down (depending on the direction of the current flow) the voltage across the capacitor (not shown), and for an inductor reactive element 1260, the excitation circuitry 1207 is configured to put a voltage across the inductor to ramp up or down (depending on the voltage polarity) the current through the inductor (not shown).

The timer circuit 1200 includes a counter circuit 1226 configured as a divider that is coupled to receive as input the FB. In accordance with some embodiments, the counter circuit 1226 operates to count occurrences of rising edges of the FB signal. The counter circuit 1226 provides a timeout signal (TO) in response to occurrence of m FB rising edges. Thus, the timer circuit 1200 delays provision of a timeout signal until a count of FB rising edges reaches m. The timeout signal can be used by a supervisor circuit to determine when to de-assert a reset signal, for example.

Figure 3:
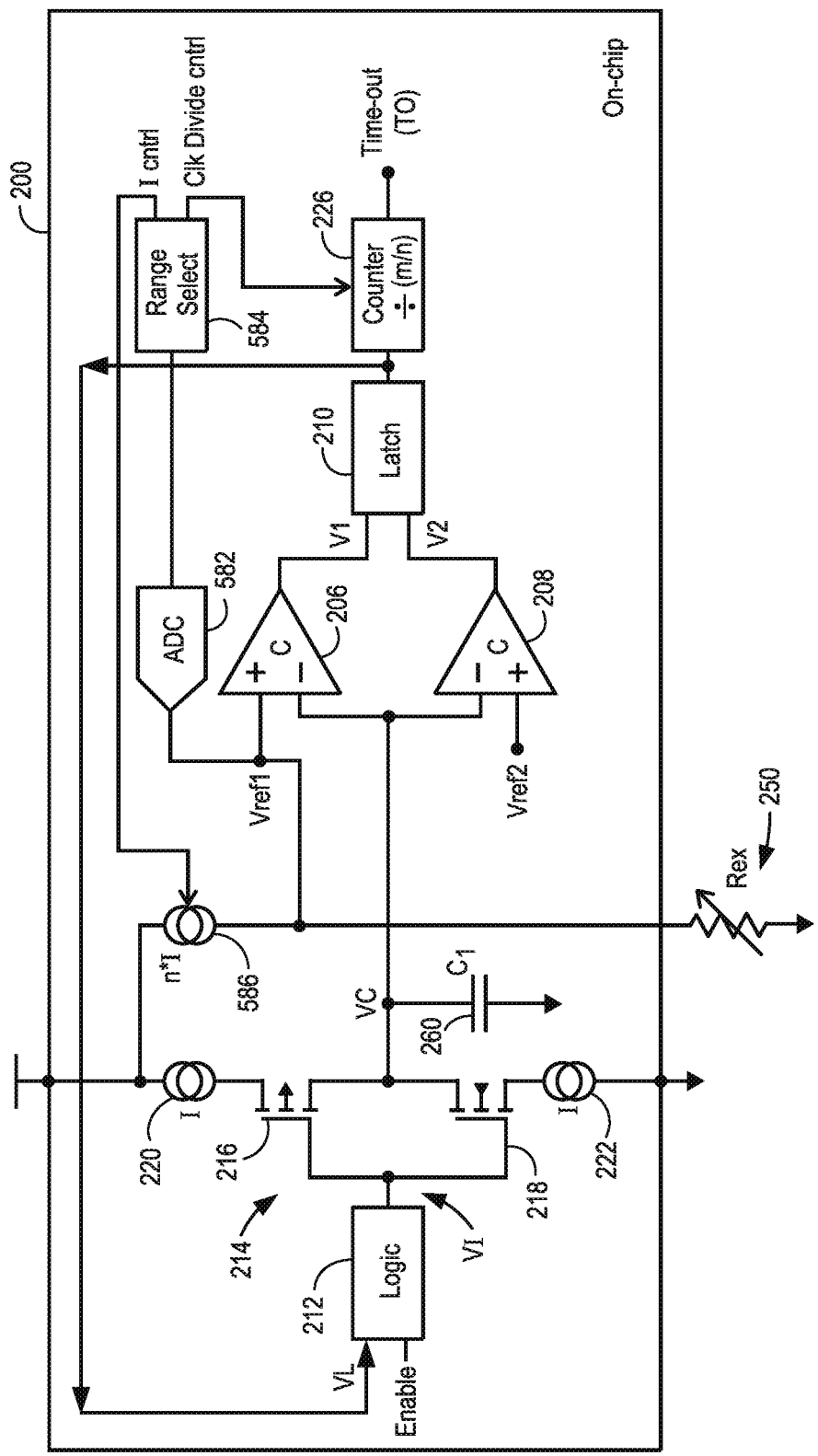
FIG. 3 is an illustrative schematic diagram showing a second embodiment of a timer circuit that includes a tunable resistor to provide a tunable reset timeout period in accordance with some embodiments.

Reference gain-ranging circuitries 1282, 1284 are used to select a tuning range of the comparator threshold $\text{Ref}_1$ to overcome comparator offset. More specifically, the comparator threshold $\text{Ref}_1$ is set so that the difference between the comparator thresholds $\text{Ref}_1$ and $\text{Ref}_2$ is large enough so that comparator offset does not become a significant source of error. To do this, before the first embodiment of the timer circuit 1200 is put into operation, during power-up for example, an ADC 1282 (analog to digital converter) performs an initial sampling and sensing of the value $\text{Ref}_1$ provided by the gain circuit 1286 based upon the $\text{Ref}_{resistor}$ value at the first resistor node 1251. For an embodiment in which the reactive element is a capacitor, the gain circuit adjusts a voltage level of $\text{Ref}_1$. For an embodiment in which the reactive element is an inductor, the gain circuit adjusts a current level of $\text{Ref}_1$. In response to the determination of the value of $\text{Ref}_1$, the range select circuit 1284 dynamically adjusts the $\text{Ref}_1$ provided by the gain circuit 1286 to within a range while setting a counter divider ratio for the counter 1226 to achieve a desired timeout interval. FIG. 3 is an illustrative schematic diagram showing a second embodiment of a timer circuit 200 that includes a tunable resistor ($R_{ext}$) 250 to provide a tunable reset timeout period in accordance with some embodiments. The tunable resistor 250 is provided as a programmable off-chip (external) resistor. The first timer works 200 through alternate excitation and reversal of excitation of a reactive element. In the second embodiment timer circuit 200, the reactive element is a capacitor 260, and excitation of the reactive element includes charging and discharging the capacitor 260 between two voltage levels $V_{ref1}$ and $V_{ref2}$. The timer circuit 200 includes first and second comparator circuits 206, 208 coupled to compare a capacitor voltage VC of the capacitor 260 with each of a first reference voltage $V_{ref1}$ and a second reference voltage $V_{ref2}$. A first terminal of the capacitor 260 is coupled to the inverting inputs of the first and second comparators 206, 208. A second terminal of the capacitor 260 is coupled to ground. A first terminal of the tunable resistor 250 is coupled to a non-inverting input of the first comparator 206. A second terminal of the tunable resistor 250 is coupled to ground. The voltage $V_{ref2}$ is coupled to the non-inverting input of the second comparator 208.

The value $V_{ref1}$ is variable and is determined based at least in part upon the value of tunable resistor 250. A programmable current source 586 produces a current I that flows through the tunable resistor 250. In accordance with some embodiments, the value $V_{ref1}$ is determined according to the relationship, $$V_{ref1} = I \times R_{ext}$$

The value of $V_{ref2}$ is selected to be sufficiently less than $V_{ref1}$ and for the second comparator 208 to produce a transition of signal V2 in response to discharge of the tunable capacitor 260.

It will be appreciated that as compared to external capacitors, resistors typically have a relatively better absolute accuracy and less temperature drift, thus significantly improving the timing accuracy of capacitor-programmable timers. Moreover, it will be appreciated that tuning the tunable resistor 250 may include physically replacing one resistor with a different resistor or may include adjusting one or more tap connections to a fixed resistor, for example.

The comparator circuits 206, 208 are further coupled to provide first and second comparison voltage signals V1, V2 that transition in state in response to charging and discharging, respectively, of the capacitor 260 voltage VC. In other words, a value of the first comparison signal V1 transitions in response to the capacitor 260 charging, and a value of the second comparison signal V2 transitions in response to the capacitor 260 discharging. A latch circuit 210 is coupled to change state in response to changes in V1 and V2 so as to produce an output voltage VL state having a value indicative of the most recently transitioned comparison voltage signal V1 or V2. In other words, between occurrences of transitions of the first and second comparison signals, the latch circuit 210 stores a state value VL that is indicative of the most recently provided one of the first and second comparison voltage signals. The stored latch state value VL is indicative of which switch state the switch 214 currently is in at times while the capacitor voltage is between the two reference levels. $V_{ref1}$ and $V_{ref2}$.

The timer circuit 200 includes logic circuitry 212 and a switch 214. The logic circuitry 212 is coupled to receive the VL signal, which is fed back from the latch 210, and to also receive an Enable signal. In response to the Enable signal enabling the logic circuitry 212, it provides as its output a VI signal that acts as an input to the switch 214.

The switch 214 includes a PMOS device 216 and an NMOS device 218 having their drains coupled together so that the PMOS device 216 acts as a voltage pull-up device and the NMOS device acts as a voltage pull-down device. The gates of the both the PMOS device 216 and the NMOS device 218 are coupled to receive signal VI (voltage input), which in a current embodiments is a slightly phase shifted version of signal VL. A second current source 220 is coupled to provide current I to a source of the PMOS device 216. A current sink 222 is coupled to sink a current I from a source of the NMOS device 218. The drains of the PMOS device 216 and the NMOS device 218 are coupled to a switch output terminal 224 that is coupled to a first terminal of the capacitor 260. A second terminal of the capacitor 260 is coupled to ground.

The timer circuit 200 includes a counter circuit 226 that is coupled to receive as input the VL, signal produced by the latch. The counter circuit 226 operates to count occurrences of rising edges of the VL signal. The counter circuit 226 is configured as a divider circuit that provides a timeout signal (TO) in response to occurrence of in VL rising edges. More particularly, in accordance with some embodiments, the counter is configured to roll over to zero when count reaches m. Thus, the timer circuit 200 delays provision of a timeout signal until a count of VL rising edges reaches m. The timeout signal can be used by a supervisor circuit to determine when to de-assert a reset signal, for example.

Figure 4:
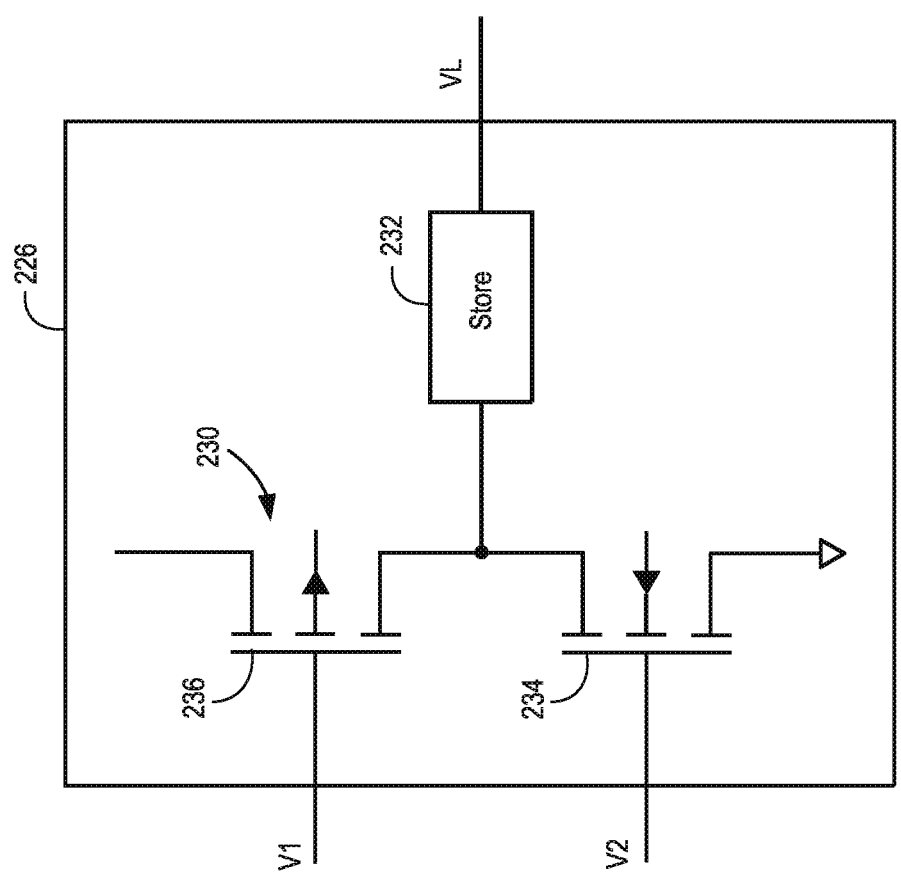
FIG. 4 is an illustrative drawing showing certain details of a latch circuit of the embodiment of FIG. 3 in accordance with some embodiments.

FIG. 4 is an illustrative drawing showing certain details of a latch circuit 226 in accordance with some embodiments. The latch circuit 226 includes an inverter circuit 230 that acts as an interface to a state storage circuit 232. The inverter 230 includes PMOS pull-up device 236 and an NMOS pull-down device 234. A gate of the PMOS pull-up device 236 is coupled to receive the V1 signal. A gate of the NMOS pull-up device 234 is coupled to receive the V2 signal. The interface 230 output provides an input to a state storage circuit 232 that save the last defined state of the interface 230 output. The state storage circuit 232 outputs a latch output signal value VL, indicative of the most recently received signal, V1 or V2.

It will be appreciated that the latch 210 itself acts as an interface between the first and second comparators 206, 208 and the switch 214. As will be clear from the timing diagram of FIG. 5, the rising edge of the latch signal VL provides indications of occurrences of signal V1, which indicates that VC is greater than $V_{ref1}$. Conversely, the falling edge of the latch signal VL, provides indications of occurrences of signal V2, which indicate that VC is less than $V_{ref2}$. A slightly phase shifted version of the latch signal VL is fed back to the switch 214, which discharges the capacitor 260 in response to an indication that VC is greater than $V_{ref1}$ and which charges the capacitor 260 in response to an indication that VC is less than Vref2.

The latch 210 also acts as an interface between the first and second comparators 206, 208 and the counter 226. A count advances (increments or decrements depending upon embodiment of the counter) in response to each rising edge of the latch signal VL. Each rising edge of the latch occurs only after both an occurrence of a VI signal and an occurrence of a V2 signal.

Gain ranging circuitry 582, 584, in combination with the tunable resistor, to provide a tunable reset timeout period in accordance with some embodiments. An analog to digital converter (ADC) 582 is coupled to sample a voltage value Vref1. The ADC 582 is coupled to a range select circuit 584 configured to select a current multiplier n to use to determine a value of a programmable current source 586 and to use to determine a corresponding counter divide ratio m/n for use in the second embodiment of the timer circuit 200.

The programmability for the time-out period is implemented by varying the comparator threshold $V_{ref1}$, which is achieved by varying the value of the tunable resistor ($R_{ext}$) 250. A limitation upon the practical timeout range of the first timer 200 is that in some applications, the comparators should be able to accurately handle wide range of magnitudes of $V_{ref1}$, such as a four orders of magnitude range of $V_{ref1}$. However, comparators that are accurate over a voltage range that can vary by four orders of magnitude can be expensive and difficult to implement, and therefore, impractical.

The gain-ranging circuitry 582, 584 is used to fix a tuning range of the comparator threshold $V_{ref1}$ to overcome the comparator offset. More specifically, the comparator threshold $V_{ref1}$ is set so that the difference between the comparator thresholds is large enough so that comparator offset does not become a significant source of error. To do this, before the second embodiment of the timer circuit 200 is put into operation, during power-up for example, the ADC 582 performs an initial sampling and sensing of the value $V_{ref1}$ for a selected value of resistor 250. In response to a determination of the value of $V_{ref1}$, the range select circuit 584 dynamically adjusts the n factors so as to set $V_{ref1}$ within a desired voltage range while setting a counter divider ratio to achieve a desired timeout interval. More particularly, the ADC 582 samples the $V_{ref1}$ resulting from a sample current value I and a selected value for the tunable resistor 250. It will be understood that in general, a larger value for the tunable resistor 250 is used to achieve longer timeout interval, and a smaller value for the tunable resistor 250 is used to achieve a shorter timeout interval. However, by increasing the value of current used to generate $V_{ref1}$ for a smaller values of resistor 250 by a factor n, for example, a $V_{ref1}$ value can be achieved for the smaller value of resistor 250 that is in the same range as a $V_{ref1}$ value for a larger value of resistor 250 for which the current is not increased by the factor n. The increased current used with the smaller value of resistor 250, which is scaled by a factor of n, is compensated for by making a corresponding scaling of the counter divider ratio m by the inverse of the same factor n, to achieve the expected shorter time-out period for the smaller value of the resister 250.

Neglecting the comparator offset and propagation delay, and assuming that the current sources I are equally matched, the timeout period for the circuit of FIG. 3 can be represented as, $$\text{Timeout} = \frac{2(m/n)C_1}{I}(Vref1 - Vref2) = \frac{2mC_1}{nI}(n*I\ Re\ x) = 2mC_1\ Re\ x$$

It can be observed that the current I gets cancelled out in the equation, thus relaxing the accuracy requirement for the on-chip bias currents. Also, it is noted that the time-out period is ideally dependent upon the counter divide ratio in, the on-chip capacitor $C_1$, and the external resistor $R_{ex}$.

Figure 5:
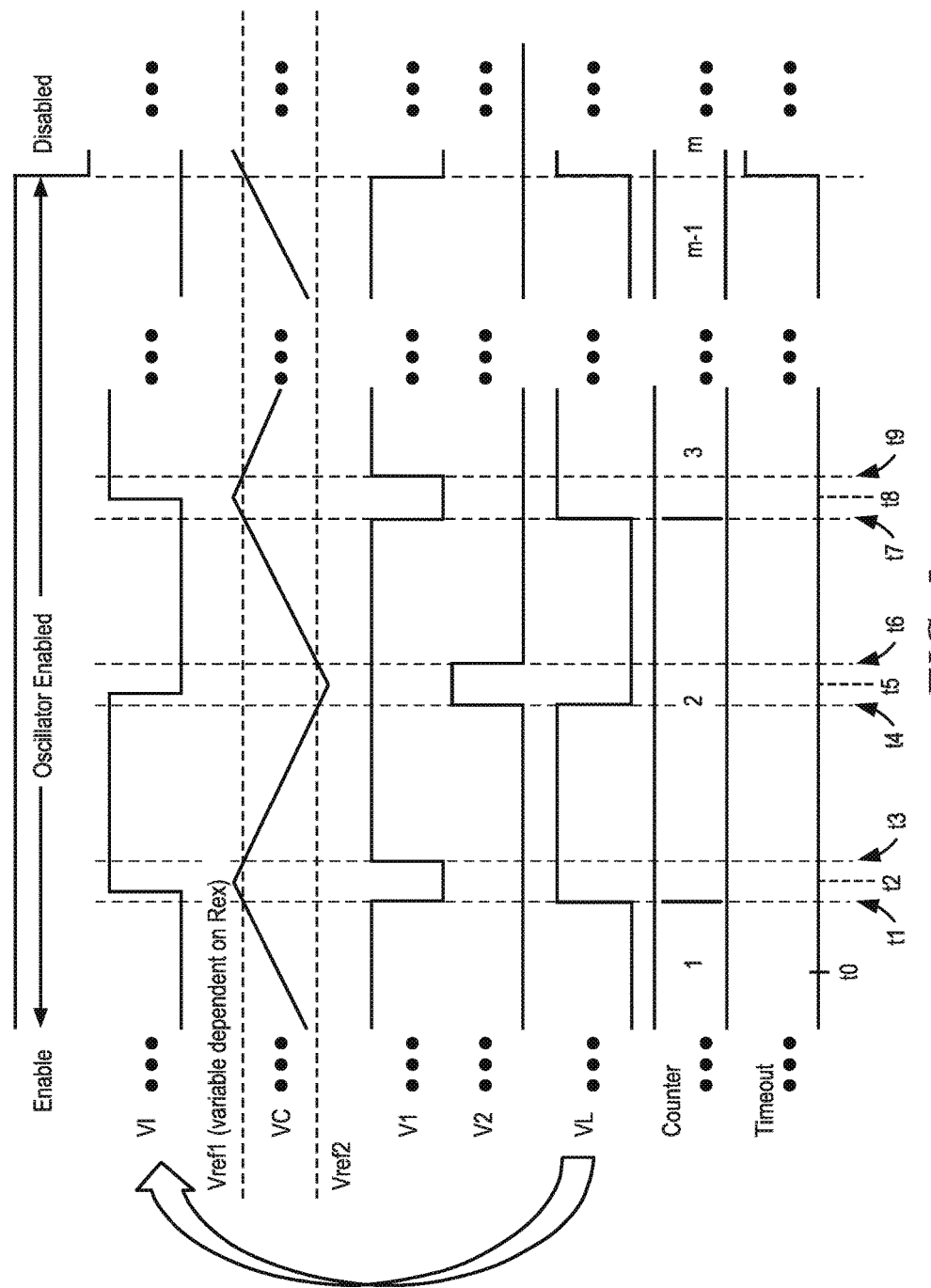
FIG. 5 is an illustrative timing diagram representing the operation of the second embodiment timer circuit of the FIG. 3 in accordance with some embodiments.

FIG. 5 is an illustrative timing diagram representing the operation of the timer circuit 200 of FIG. 3 in accordance with some embodiments. It is assumed that at time to, the timer circuit 200 already is enabled and has just completed its first count and hence the count is 1 at t0. It is assumed that the counter 226 detects and counts a positive edge from VL. However in an alternative embodiment (not shown), a counter could be configured to detect a falling edge.

At time t0, VI and VL have logic low values, and the capacitor voltage VC is charging, i.e. increasing in value. V1 has a logic level high value and V2 has a logic level low value. The timeout signal (TO) has a logic level low value.

At time t1, the value of VC surpasses the value of $V_{ref1}$. In response to the capacitor 260 charging to a VC value greater than the value $V_{ref1}$, the first comparator 206 produces a transition of V1 from the logic high level value to a logic level low value. In response to the transition of V1 to a logic low level value, the latch circuit 210 produces a logic level low to high transition of VL. It will be appreciated that the latch circuit 210 produces a logic level low to high transition of VL in response to a falling edge transition of V1. In response to the rising edge of VL, the counter circuit 226 produces a count increment from 1 to 2. The value VL is fed back to the logic circuit 212, which in turn provides VI, which is a phase shifted version of VL. The timeout signal (TO) still has a logic level low value.

At time t2, VI transitions from a logic level low value to a logic level high value. In response to the transition of VI from low to high, PMOS device 216 turns off and NMOS device 218 turns on and the capacitor 260 transitions from charging to discharging. The voltage V2 remains at the logic level low value. The count remains 2. The timeout signal (TO) still has a logic level low value.

At time t3, the value of VC falls below the value of $V_{ref1}$. In response to the capacitor 260 discharging to a VC value less than the value $V_{ref1}$, the first comparator 206 produces a transition of V1 from a logic level low value to a logic level high value. However, the latch circuit 210 continues to provide VL at a logic level high value. Thus, it will be appreciated that the latch circuit 210 does not produce a logic level transition of VL in response to a rising trailing edge transition of V1. The voltage VC of the capacitor 260 continues to discharge. The voltage V2 remains at the logic level low value. The count remains 2. The timeout signal (TO) still has a logic level low value.

At time t4, the value of VC falls below the value of $V_{ref2}$. In response to the capacitor 260 discharging to a VC value less than the value $V_{ref2}$, the second comparator 208 produces a transition of V2 from a logic low level value to a logic level high value. In response to the transition of V2 to a logic level high value, the latch circuit 210 produces a logic level high to low transition of VL. It will be appreciated that the latch circuit 210 produces a logic level high to low transition of VL in response to a rising leading edge transition of V2. The value VL is fed back to the logic circuit 212, which in turn provides a high to low transition of VI, which is a phase shifted version of VL. The voltage V1 remains at the logic level high value. The count remains 2. The timeout signal (TO) still has a logic level low value.

At time t5, VI transitions from a logic level high value to a logic level low value. In response to the transition of VI from high to low, PMOS device 216 turns on and NMOS device 218 turns off and the capacitor 260 transitions from discharging to charging. The voltage V1 remains at the logic level high value. The count remains 2. The timeout signal (TO) still has a logic level low value.

At time t6, the value of VC rises above the value of $V_{ref2}$. In response to the capacitor 260 charging to a VC value greater than the value $V_{ref2}$, the second comparator 208 produces a transition of V2 from a logic level high value to a logic level low value. However, the latch circuit 210 continues to provide VL at a logic level low value. Thus, it will be appreciated that the latch circuit 210 does not produce a logic level transition of VL in response to a falling trailing edge transition of V2. The voltage VC of the capacitor 260 continues to charge. The voltage V1 remains at the logic level high value. The count remains 2. The timeout signal (TO) still has a logic level low value.

At time t7, the value of VC again surpasses the value of $V_{ref1}$. In response to the capacitor 260 charging to a VC value greater than the value $V_{ref1}$, the first comparator 206 produces a transition of V1 from the logic high level value to a logic level low value. In response to the transition of V1 to a logic low level value, the latch circuit 210 produces a logic level low to high transition of VL. It will be appreciated that the latch circuit 210 produces a logic level low to high transition of VL in response to a falling leading edge transition of V1. In response to the rising edge of VL, the counter circuit 226 produces a count increment from 2 to 3. The value VL is fed back to the logic circuit 212, which in turn provides VI, which is a phase shifted version of VL. The timeout signal (TO) still has a logic level low value.

At time t8, VI again transitions from a logic level low value to a logic level high value. In response to the transition of VI from low to high, PHOS device 216 turns off and NMOS device 218 turns on and the capacitor 260 again transitions from charging to discharging. The voltage V2 remains at the logic level low value. The count remains 3. The timeout signal (TO) still has a logic level low value.

At time t9, the value of VC again falls below the value of $V_{ref1}$. In response to the capacitor 260 discharging to a VC value less than the value $V_{ref1}$, the first comparator 206 again produces a transition of V1 from a logic level low value to a logic level high value. However, the latch circuit 210 continues to provide VL at a logic level high value. The voltage VC of the capacitor 260 continues to discharge. The voltage V2 remains at the logic level low value. The count remains 3. The timeout signal (TO) still has a logic level low value.

The cycle continues until the count reaches m whereupon the timeout signal transitions from logic level low value to logic level high value. The transition of the timeout signal to a high value may be used to indicate to a supervisor circuit (not shown), for example, that reset timeout interval has completed, and that a device (not shown) under control of the supervisor now may be put into active use through de-assertion of a reset signal (not shown), for example. Also, in response to transition of the timeout signal to a high value, the Enable signal may be transitioned to a logic level low value causing the timer circuit to shut off and stop counting. Also, in accordance with some embodiments, internal nodes of the timer 200 may be clamped to a default state (not shown) in response to transition of the timeout signal to a high value.

Figure 6:
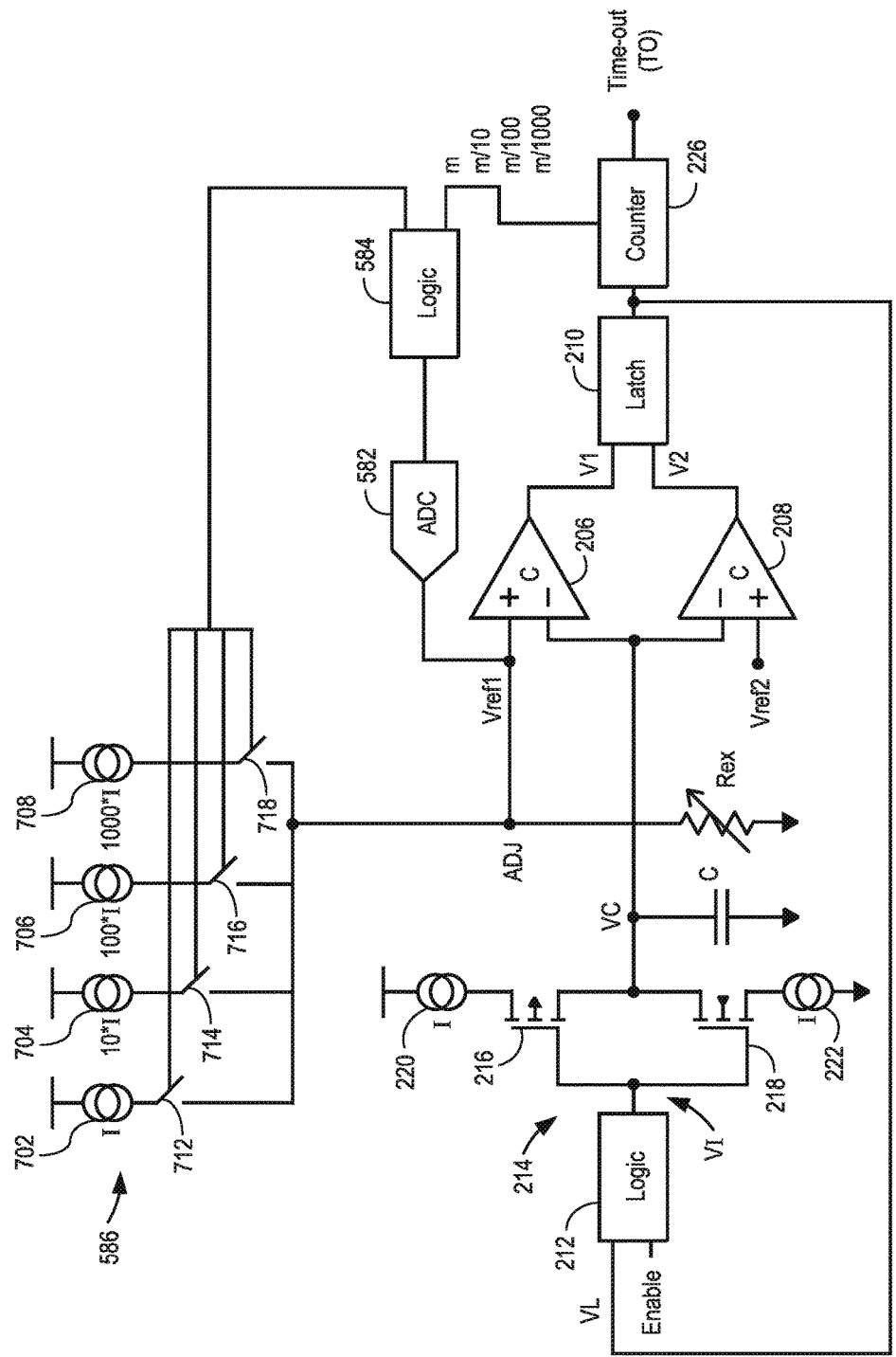
FIG. 6 is an illustrative schematic diagram of the second embodiment of FIG. 3 showing certain details of a first embodiment of the gain range circuitry in accordance with some embodiments.

FIG. 6 is an illustrative schematic diagram of the second embodiment of FIG. 3 showing certain details of first embodiment of the programmable current source 586 that is configured to adjust current through the resistor 250 so as to amplify voltage across it to obtain a $V_{refl}$ value that achieves an amplified comparator threshold voltage, so that comparator offset does not become a significant source of error, in accordance with some embodiments. A first (base) candidate current source 702 provides current I. A second candidate current source 704 provides current 10*I. A third candidate current source 706 provides current 100*I. A fourth candidate current source 708 provides current 1000*I. The range select circuit 584 selectively closes a first switch 712, to select the first current source having value I; selectively closes a second switch 714, to select the second candidate current source having value 10*I; selectively closes a third switch 716, to select the third candidate current source having value 100*I; and selectively closes a fourth switch 718, to select the fourth candidate current source having value 1000*I.

Figure 7:
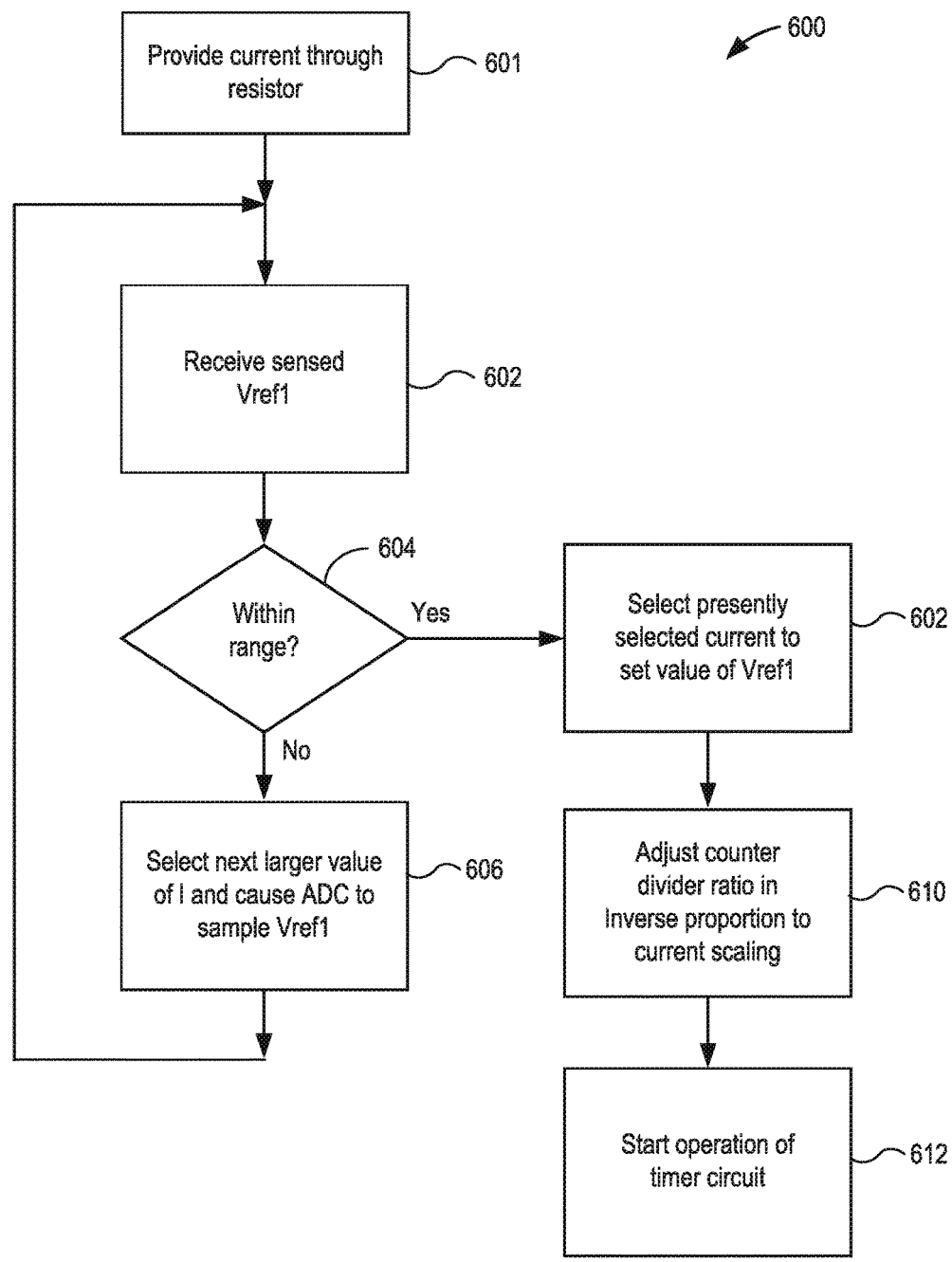
FIG. 7 is an illustrative flow diagram of a current range determination process for use with the first embodiment of the gain range circuitry of FIG. 6 in accordance with some embodiments.

FIG. 7 is an illustrative flow diagram of a current range determination process 600 for use with the first embodiment of the gain range circuitry of FIG. 6, to determine a scaling factor for use to keep $V_{refl}$ within a prescribed voltage range while achieving a desired timeout interval in accordance with some embodiments. The logic circuit 584 is configured to perform the process 600 during a startup phase before the timer circuit begins operating in a normal mode in which a counter 226 is incremented in response to cyclical charging and discharging of capacitor 260. In accordance with some embodiments, a range of different candidate current values to act as the first current 586 are available each of which is a different factor n of a base current value. More specifically assuming that the candidate base current has a value I, the range of different current sources provide the range of candidate current values for the first current 586. Table A sets forth an example set of candidate current values.

TABLE A

| n (Factor) | Current Amplification Value |
| --- | --- |
| 1 | I |
| 10 | 10*I |
| 100 | 100*I |
| 1,000 | 1,000*I |
| 10,000 | 10,000*I |

The range select circuit 584 is configured to implement the process 600 in accordance with some embodiments. More specifically, under control of the range select circuit 584, the ADC 582 senses $V_{refl}$, for a given selected value of resistor 250, for each of the candidate current values of Table A in sequence, starting with the base current value I, until a value for the current and corresponding n factor are determined for which $V_{refl}$ is within the target voltage range. The determined current value and the corresponding n factor then are used during operation of the timer circuit 200.

Referring to FIG. 7, module 601 provides an initial current value through the resistor 250. It is assumed in this embodiment that the initial current value is a lowest current value. Module 602 receives a $V_{refl}$ value sensed by the ADC 582. Decision module 604 determines whether the sensed $V_{refl}$ value is within the predetermined target voltage range. In accordance with some embodiments, the predetermined voltage range is 0.1V to 1V. In response to a determination that $V_{refl}$ is not within the target voltage range, module 606 instructs the ADC 582 to obtain a sample using a next larger available candidate current value. Control next flows back to module 602. However, in response to decision module 604 determining that $V_{refl}$ is within the target voltage range, module 608 selects the presently selected candidate current value for use during operation and module 610 applies a corresponding adjustment to the divider ratio to the counter circuit 226. In accordance with some embodiments the adjustment to the counter divider ratio is approximately in inverse proportion to the current scaling. For example, in response to a determination that a current value 100*I results in $V_{refl}$ being in range, then the counter divider ratio is adjusted to be m/100. Module 612 starts up the counting operation of the timer circuit 200.

Figure 8:
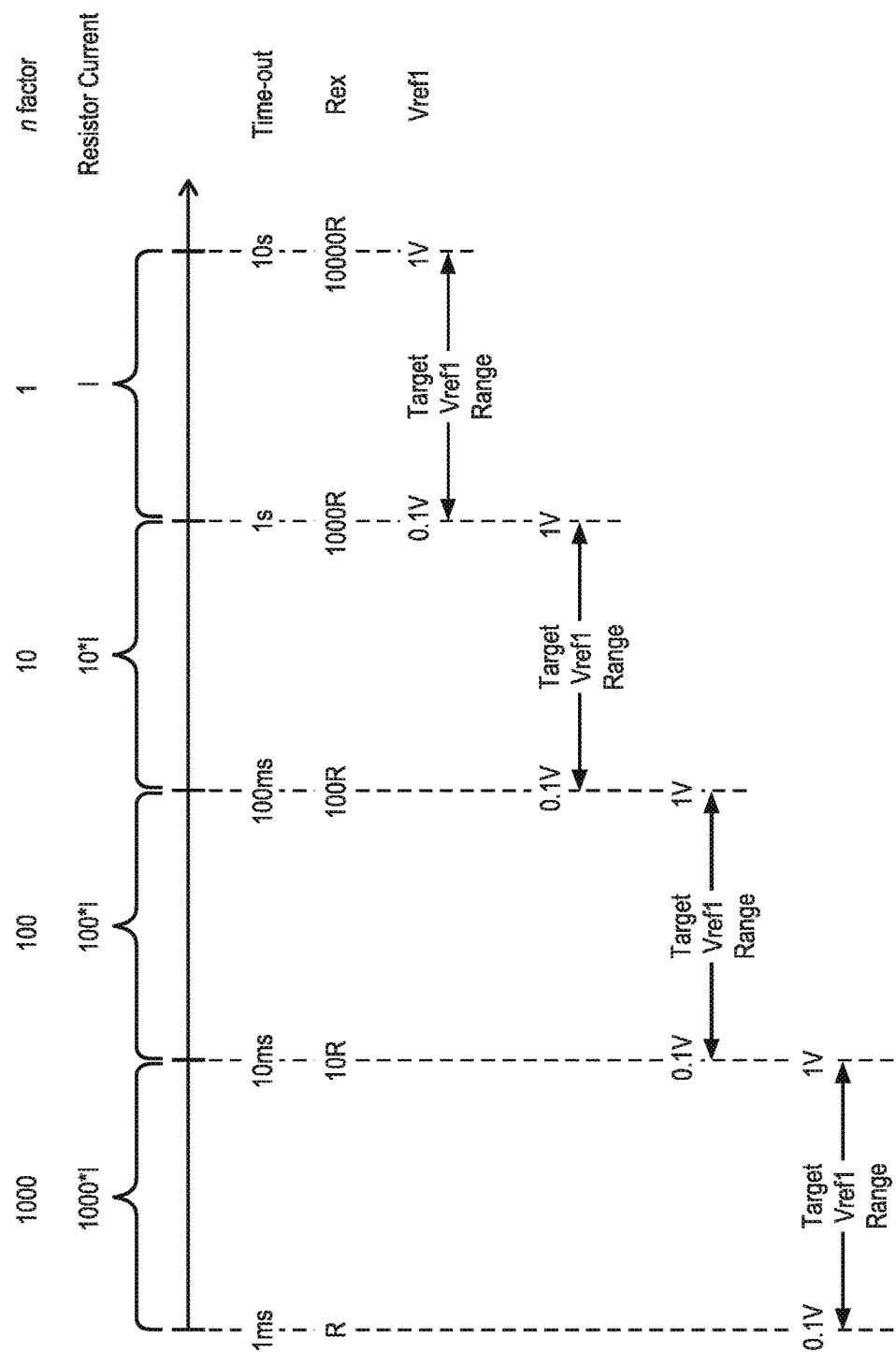
FIG. 8 is an illustrative chart showing example relationships between values of the target reference voltage range, tunable resistor, corresponding timeout delays, current values and n factors for use with the first embodiment of the gain range circuitry of FIG. 6, in accordance with some embodiments.

FIG. 8 is an illustrative chart showing example relationships between values of the target reference voltage range, $V_{refl}$, tunable resistor 250, corresponding timeout delays, current values and n factors for use with the first embodiment of the gain range circuitry of FIG. 6, in accordance with some embodiments. It is noted that target reference voltage range, $V_{refl}$ remains fixed at 0.1V to 1V for each combination of timeout delay, current value, and n factor. For example, if the tunable resistor 250 has a value R, then the timeout delay is approximately 1 ms and the current is selected to be approximately 1000*I. It will be appreciated that in this example, for resistor value 10000R, the n factor is 1 and the divider ration is m/1=m. However, if the tunable resistor 250 has a value 100R, then the timeout delay is approximately 100 ms and the current is 10*I or 100*I, whichever provides a value of $V_{refl}$ that is within range. It will be appreciated that in this example, for resistor value 100R, the n factor is 10 or 100 and the divider ratio is adjusted to be m/10 or m/100 depending upon which current value is selected. In accordance with some embodiments, the boundaries between the different ranges are not sharp. Even if the ADC 582 makes a small error in determining a sensed value for $V_{refl}$, the comparator circuitry will operate properly.

Figure 9:
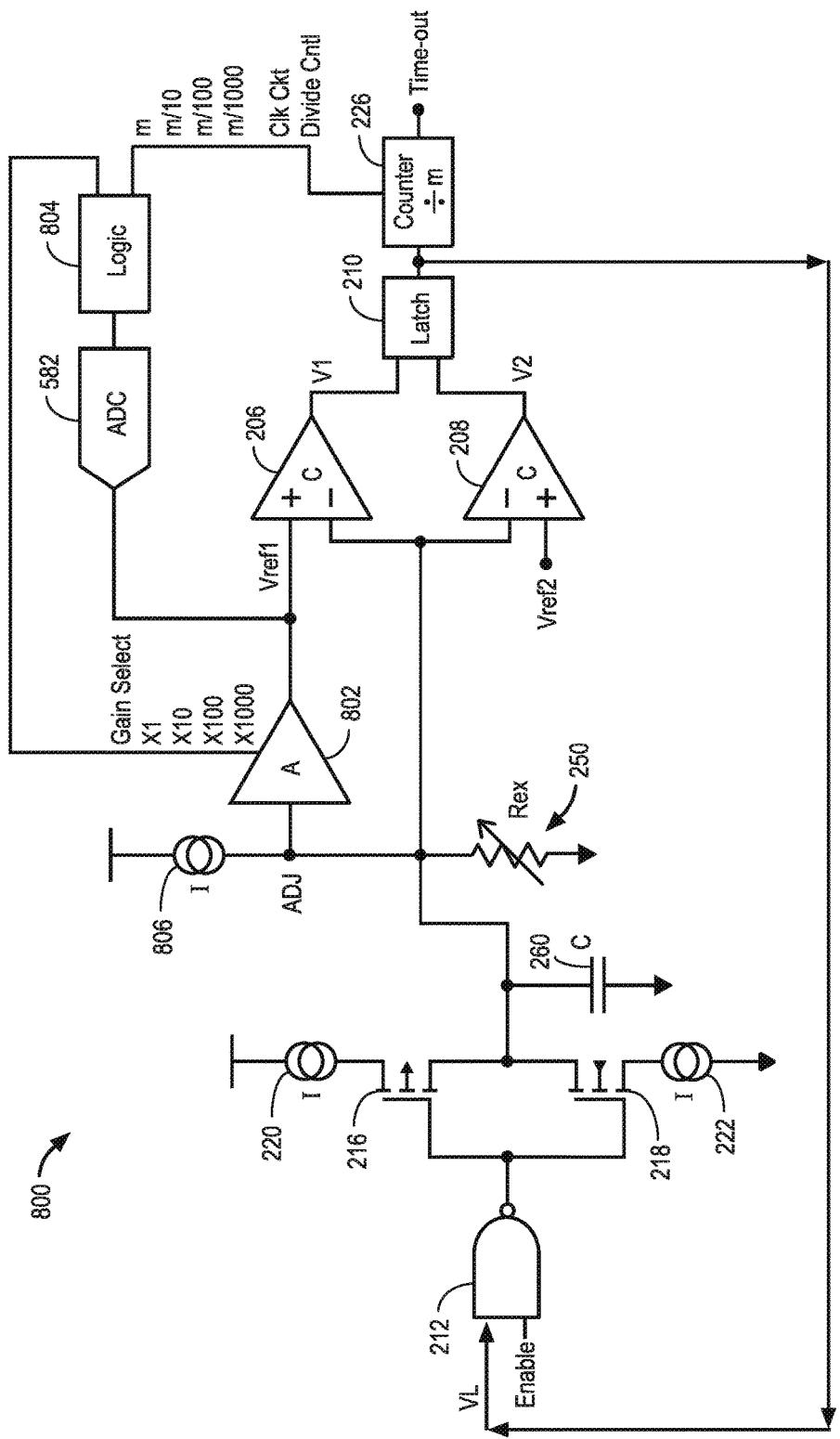
FIG. 9 is an illustrative schematic diagram of the third embodiment of a timer circuit showing certain details of a second embodiment of a gain range circuitry in accordance with some embodiments.

FIG. 9 is an illustrative schematic diagram of the third embodiment of a timer circuit 800 showing certain details of a second embodiment of the gain range circuitry 802 that is configured to adjust the $V_{refl}$ voltage value using a constant current provided by current source 806 through resistor 250, and a voltage amplifier 802 which amplifies the comparator threshold voltage so that comparator offset does not become a significant source of error, in accordance with some embodiments. Components of the third embodiment 800 that are the same as the third embodiment 200 are labeled with identical reference numbers and will not be described again. A voltage amplifier 802 is coupled to receive a voltage across resistor 250 as an input voltage and to provide as an output voltage an amplified input voltage by ×1, ×10, ×100 and ×1000 gain factors, which provides a $V_{refl}$ value in accordance with some embodiments.

Figure 10:
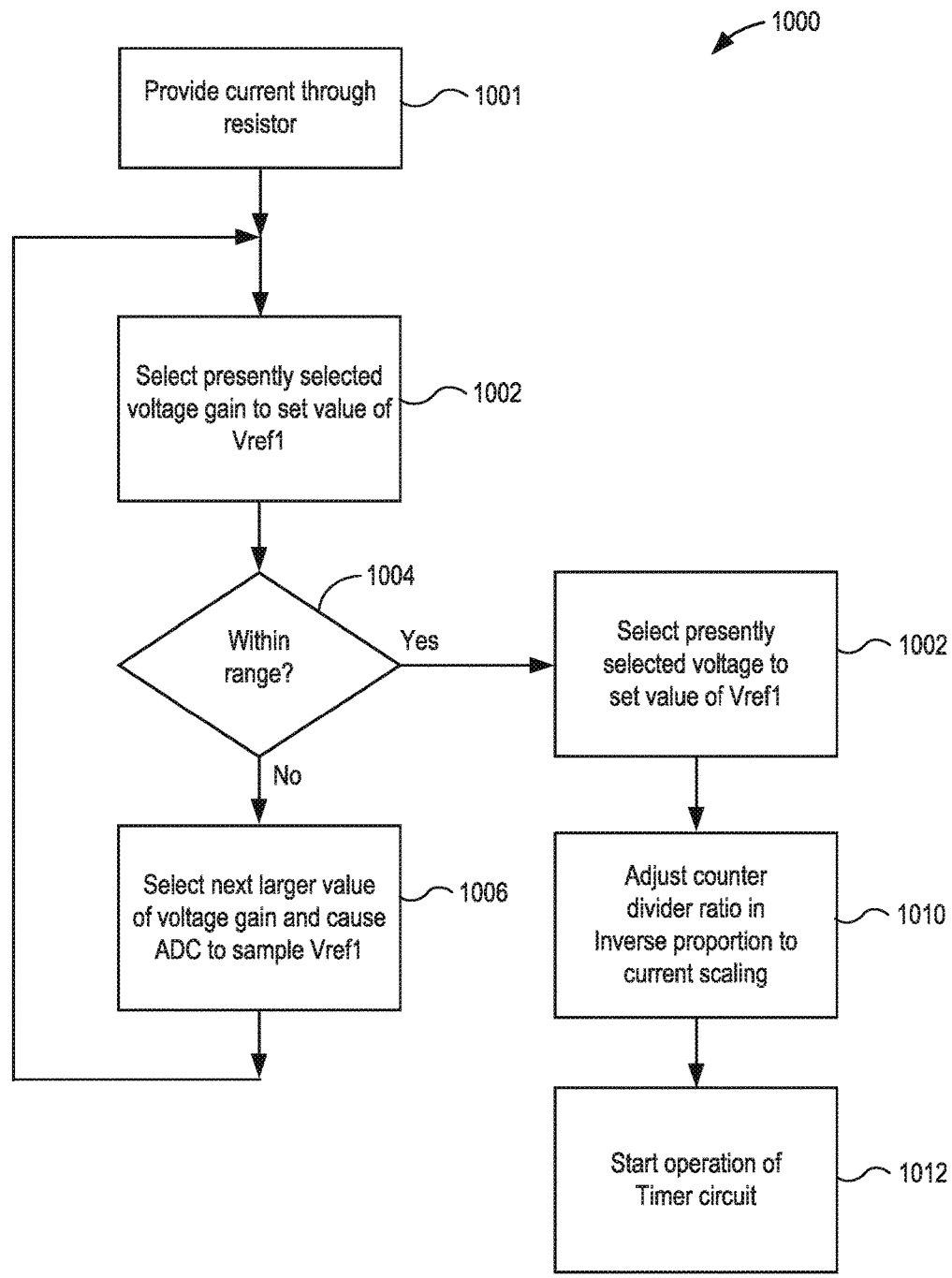
FIG. 10 is an illustrative flow diagram of a voltage range determination process for use with the second embodiment of the gain range circuitry of FIG. 9 in accordance with some embodiments.

FIG. 10 is an illustrative flow diagram of a voltage range determination process 1000 to determine a scaling factor for use to keep $V_{refl}$ within a prescribed voltage range while achieving a desired timeout interval in accordance with some embodiments. The logic circuit 804 is configured to perform process 1000 during a startup phase before the timer circuit begins operating in a normal mode in which a counter 226 is incremented in response to cyclical charging and discharging a capacitor 260. In accordance with some embodiments, a range of different candidate voltage gain values are available each of which is a different factor n of a base voltage value $IR_{ex}$. More specifically assuming that a current value I flows through the programmable resistor 250, which has a value $R_{ex}$, an output voltage $IR_{ex}$ acts as a basis for a range of candidate voltage gain values. Table B sets forth an example set of candidate current values.

TABLE B

| n (Factor) | Voltage Amplification Value |
|---|---|
| 1 | $IR_{ex}$ |
| 10 | $10*IR_{ex}$ |
| 100 | $100*IR_{ex}$ |
| 1,000 | $1,000*IR_{ex}$ |

The range select circuit 584 is configured to implement the process 1000 in accordance with some embodiments. More specifically, under control of the range select circuit 584, the ADC 582 senses $V_{refl}$, for a given selected value of resistor 250, for each of the candidate voltage amplification values of Table B in sequence, starting with the base voltage value $IR_{ex}$, until a value for the voltage gain and corresponding n factor are determined for which $V_{refl}$ is within the target voltage range. The determined voltage gain value and the corresponding n factor then are used during operation of the timer circuit 200.

Referring to FIG. 10, module 1001 provides an initial voltage value output by the voltage amplifier circuit 802. It is assumed in this embodiment that the initial voltage value is a lowest current value. Module 1002 receives a $V_{refl}$ value sensed by the ADC 582. Decision module 1004 determines whether the sensed $V_{refl}$ value is within the predetermined target voltage range. In accordance with some embodiments, the predetermined voltage range is 0.1V to 1V. In response to a determination that $V_{refl}$ is not within the target voltage range, module 1006 instructs the ADC 582 to obtain a sample using a next larger available candidate voltage gain value. Control next flows back to module 1002. However, in response to decision module 1004 determining that $V_{refl}$ is within the target voltage range, module 1008 selects the presently selected candidate voltage gain value for use during operation and module 1010 applies a corresponding adjustment to the divider ratio of the counter circuit 226. In accordance with some embodiments the adjustment to the counter divider ratio is approximately in inverse proportion to the voltage amplification. For example, in response to a determination that a voltage value $100*IR_{ex}$ results in $V_{refl}$ being in range, then the counter divider ratio is adjusted to be m/100. Module 1012 starts up the counting operation of the timer circuit 800. The foregoing description and drawings of embodiments are merely illustrative of the principles of the invention. Various modifications can be made to the embodiments by those skilled in the art without departing from the spirit and scope of the invention, which is defined in the appended claims.

The invention claimed is:

1. A circuit comprising:
a resistor that produces a resistor voltage based on a current from a first current source passing through the resistor;
a programmable gain circuit coupled to amplify the resistor voltage based upon a selected gain;
a comparator circuit configured to compare a capacitor voltage of a capacitor with the amplified resistor voltage and a reference voltage; and
a capacitor excitation circuit configured to change excitation of the capacitor in response to an output of the comparator circuit.

2. The circuit of claim 1,
wherein the comparator circuitry includes a first comparator coupled to compare the capacitor voltage to the amplified resistor voltage; and
wherein the comparator circuitry includes a second comparator coupled to compare the capacitor voltage to the reference voltage.

3. The circuit of claim 1, wherein the comparator transitions between providing as the output a first value and a second value based at least in part upon comparisons of the capacitor voltage with the amplified resistor voltage and with the reference voltage, further including:
a latch circuit configured to change a stored state in response to each occurrence of the first value and each occurrence of the second value, wherein stored latch state is indicative of capacitor excitation circuit state while capacitor voltage is between the amplified resistor voltage and the reference voltage.

4. The circuit of claim 1, further including:
a second current source; and
a current sink;
wherein the capacitor excitation circuit includes a first switch configured to alternately couple the capacitor to the second current source to charge the capacitor voltage and couple the capacitor to the current sink to discharge the capacitor voltage.

5. The circuit of claim 1 further including:
a second current source; and
a current sink;
wherein the capacitor excitation circuit includes a first switch that includes an inverter circuit that includes a voltage pull-up device and a voltage pull-down device, wherein the voltage pull-up device is configured to couple the capacitor to the second current source to charge the capacitor voltage, and wherein the voltage pull-down device is configured to couple the capacitor to the current sink to discharge the capacitor voltage.

6. The circuit of claim 1 further including:
a counter circuit configured as a divider circuit that provides a timeout signal; and
an interface circuit that includes a latch circuit that is configured to provide indications of changes in the output of the comparator circuit;
wherein a selection circuit is further configured to change a divider ratio of the divider circuit in substantially an inverse proportion to the selected gain.

7. The circuit of claim 1, further comprising a detection circuit that includes an analog to digital converter (ADC) configured to identify the amplified resistor voltage.

8. The circuit of claim 1,
wherein the programmable gain circuit includes a programmable voltage amplifier to receive as input a signal indicative of the resistor voltage and to provide as output a signal indicative of the amplified resistor voltage.

9. The circuit of claim 1,
wherein the programmable gain circuit is configured to amplify the resistor voltage by a selected one of multiple candidate gain levels; and
wherein a selection circuit selects a candidate gain level based upon the amplified resistor voltage and a target for a range of the amplified resistor voltage.

10. A circuit modulation method comprising:
producing a resistor voltage by passing a current from a current source through the resistor;
amplifying the resistor voltage by adjusting a gain applied to the resistor voltage;
comparing a capacitor voltage with the amplified resistor voltage and a reference voltage; and
changing a ramp direction of the capacitor voltage based upon the comparison.

11. The method of claim 10 further including:
storing an indication of the ramp direction of the capacitor voltage, when the capacitor voltage is between the resistor voltage and the reference voltage.

12. The method of claim 10 further including:
advancing a counter to a prescribed number of occurrences of discharging the capacitor voltage and charging the capacitor voltage.

13. The method of claim 10 wherein the reference voltage is a fixed voltage, and wherein the gain is adjusted in a startup mode before changing the ramp direction of the capacitor voltage.

14. The method of claim 10,
wherein changing ramp direction includes changing ramp direction in response to the capacitor voltage being greater than the resistor voltage and changing ramp direction in response to the capacitor voltage being less than the reference voltage.

15. The method of claim 10 further including:
determining a timeout count based upon a ratio of a number of changes in ramp direction and the resistor voltage.

16. The method of claim 10 further including:
selecting the gain from among multiple discrete resistor voltage level gains.

17. The method of claim 10, further including storing a first value in response to detecting that the capacitor voltage is greater than the resistor voltage and storing a second value in response to detecting that the capacitor voltage is less than the reference voltage, the first and second values causing the change in the ramp direction.

18. The method of claim 10, further including:
selecting a candidate gain level based upon the amplified resistor voltage and a target for a range of the amplified resistor voltage; and
selecting from among multiple resistor voltage gains.

19. The method of claim 10, further including:
selecting a candidate gain level based upon the amplified resistor voltage and a target for a range of the amplified resistor voltage; and
determining a timeout count based upon a ratio of a number of changes in ramp direction and the adjusted resistor voltage.

20. An apparatus comprising:
means for producing a resistor voltage by passing a current from a current source through the resistor;
means for amplifying the resistor voltage by adjusting a gain applied to the resistor voltage;
means for comparing a capacitor voltage with the amplified resistor voltage and a reference voltage; and
means for changing a ramp direction of the capacitor voltage based upon the comparison.

21. The apparatus of claim 20 further comprising means for storing an indication of the ramp direction of the capacitor voltage, when the capacitor voltage is between the resistor voltage and the reference voltage.

22. The apparatus of claim 20 further comprising means for advancing a counter to a prescribed number of occurrences of discharging the capacitor voltage and charging the capacitor voltage.

23. The apparatus of claim 20 further comprising:
selecting a candidate gain level based upon the amplified resistor voltage and a target for a range of the amplified resistor voltage; and
selecting from among multiple resistor voltage gains.

* * * * *